United States Patent [19]

Mallon

[11] 4,063,042
[45] Dec. 13, 1977

[54] CIRCUIT ARRANGEMENT FOR DECODING A FREQUENCY MODULATED STEREO RADIO SIGNAL

[75] Inventor: Dietmar Mallon, Zorneding, Germany

[73] Assignee: Siemens Aktiengesellschaft, Berlin & Munich, Germany

[21] Appl. No.: 659,945

[22] Filed: Feb. 20, 1976

[30] Foreign Application Priority Data

Mar. 13, 1975  Germany .............................. 2511098

[51] Int. Cl.² ............................................. H04H 5/00
[52] U.S. Cl. ................................ 179/15 BT; 330/109
[58] Field of Search ..................... 179/15 BT; 325/36; 330/98, 109

[56] References Cited
U.S. PATENT DOCUMENTS

| | | | |
|---|---|---|---|
| 3,432,764 | 3/1969 | Kermicle | 330/98 |
| 3,798,376 | 3/1974 | Limberg | 179/15 BT |
| 3,805,178 | 4/1974 | Rollett | 330/109 |
| 3,829,626 | 8/1974 | Irwin et al. | 330/109 |

Primary Examiner—Douglas W. Olms
Attorney, Agent, or Firm—Hill, Gross, Simpson, Van Santen, Steadman, Chiara & Simpson

[57] ABSTRACT

A circuit arrangement for decoding a frequency-modulated stereo radio signal includes a FM demodulator followed by a stereo decoder and a matrix. In the matrix, by sum and difference formation, two reproduction signals are formed from a sum signal component of the output signal of the FM demodulator and from a difference signal component which has been converted from an auxiliary carrier frequency state into the audio frequency state by a synchronous demodulator. The stereo decoder is preceded by a correcting amplifier which comprises an operational amplifier having the highest possible amplification and possessing a non-inverting input and an inverting input. The output of the amplifier is fed back by way of a RC element to the inverting input so that a linear frequency response of the sum signal component and the difference signal component is formed.

2 Claims, 2 Drawing Figures

CIRCUIT ARRANGEMENT FOR DECODING A FREQUENCY MODULATED STEREO RADIO SIGNAL

BACKGROUND OF THE INVENTION

1. Field of the Invention

This invention relates to a circuit arrangement for decoding a frequency-modulated stereo radio signal, in which a FM modulator is followed by a stereo decoder and a matrix in which, by sum and difference formation, two reproduction signals are formed in the matrix from a sum signal component of the output signal of the FM demodulator and from a difference signal component converted from an auxiliary carrier frequency state into the audio frequency state by a synchronous demodulator.

2. Description of the Prior Art

The so-called MPX signal supplied by the FM demodulator in a radio receiver contains three components. The first component is a sum signal (L+R) consisting of the left-hand item of information L and the right-hand item of information R in the audio-frequency range from 30 Hz to 15 kHz. The second component is a difference signal (L−R) consisting of the left-hand item of information L and the right-hand item of information R which is modulated onto a suppressed auxiliary carrier of, for example, 38 kHz. The frequency band for the difference signal (L−R) extends, with the lower and upper side bands, from, for example, 23 kHz to 53 kHz. A third component serves to transmit a pilot tone of 19 kHz, for example, which allows the 38 kHz auxiliary carrier to be regenerated in the stereo decoder.

The synchronous demodulator converts the difference signal (L−R) from the 38 kHz state into the audio-frequency state with the help of the 38 kHz auxiliary carrier. Both of the signals in the audio-frequency state—the sum signal (L+R) and the difference signal (L−R) are combined in the matrix to form the two reproduction signals $U_L$ and $U_R$ which corresponds to the left-hand information L and the right-hand information R, in accordance with the following equations:

$$(L+R) + (L-R) = 2L; \text{ and}$$

$$(L+R) - (L-R) = 2R.$$

A prerequisite of the fulfillment of these equations for the left-hand information L and the right-hand information R, i.e. that the two reproduction signals $U_L$ and $U_R$ should contain exclusively the left-hand information L and the right-hand information R, respectively, and that there should be no crosstalk between these signals is that the sum signal (L+R) and the difference signal (L−R) should be identical in terms of amplitude and phase. As, however, the sum signal (L+R) is transmitted in the audio-frequency state, and the difference signal (L−R) is transmitted in the auxiliary carrier frequency state, a nonlinear frequency response manifests itself in the form of cross talk between the two reproduction signals $U_L$ and $U_R$. If it is assumed that the FM demodulator possesses a linear frequency response, but that it is connected via a connection line to the stereo decoder, then at the input of the stereo decoder, the amplitudes of the higher frequencies are reduced in relation to those of the lower frequencies in that the connection lines forms a RC low pass filter. This means that the difference signal (L−R) is somewhat lower in terms of amplitude than the sum signal (L+R), and that the two signals no longer agree in terms of phase. Consequently, the two above-mentioned equations are no longer fulfilled, and an undesired cross talk occurs between the two reproduction signals $U_L$ and $U_R$. In an unfavorable situation, nonlinearities of the FM demodulator will serve to further increase such an effect.

SUMMARY OF THE INVENTION

The object of the present invention, therefore, is to provide a circuit arrangement with the aid of which it is possible to avoid the crosstalk, caused by the reasons described above, between the reproduction signals $U_L$ and $U_R$ of a stereo receiver.

In order to realize the above objects, a circuit arrangement, according to the present invention, is constructed such that the stereo decoder is preceded by a correcting amplifier which comprises an operational amplifier exhibiting the highest possible degree of amplification, the operational amplifier having a non-inverting input and an inverting input and a RC feedback circuit between the output and the inverting input which provides a linear frequency response of the sum signal component and of the difference signal component.

In an advantageous embodiment of a circuit arrangement constructed in accordance with the invention, the correcting amplifier contains a differential amplifier having two transistors which are interconnected at their emitters, and where the base of the first transistor is connected to an input for the signal supplied by the FM demodulator. The two collectors are linked to each other by way of a current reflector and are connected to a reference potential. The emitters are connected by way of a constant current source to a supply potential and, in addition, the collector of the first transistor is connected to the base of an amplifier transistor whose emitter is connected to a reference potential and whose collector is connected by way of a resistor to the supply potential. The collector of the amplifier transistor is connected by way of a series resistor, and by way of a shunt capacitor leading to the reference potential, to the base of the second transistor of the differential amplifier, and represents the output for the corrected signal which is to be decoded.

By virtue of a linearization, effected with simple means, of the signal which is to be decoded, a circuit arrangement constructed in accordance with the present invention achieves a considerable damping of crosstalk between the two reproduction signals $U_L$ and $U_R$. It is fundamentally irrelevant how the sum signal (L+R) and the difference signal (L+R) are split up in the stereo decoder. However, a circuit arrangement constructed in accordance with the invention can be used advantageously, in particular in the situation in which there is no splitting of signals by a low pass filter and a band pass filter, but where the entire signal is fed to the one matrix input and the entire signal is fed to the synchronous demodulator which converts the sum signal (L+R) into the auxiliary carrier frequency state and the difference signal (L−R) into the audio frequency state, and where the two converted signals are fed to the other matrix input and the undesired components of the reproduction signals $U_L$ and $U_R$ in the auxiliary carrier frequency state can easily be filtered out by appropriate low pass filters.

BRIEF DESCRIPTION OF THE DRAWING

Other objects, features and advantages of the invention, its organization, construction and operation will be best understood from the following detailed description taken in conjunction with the accompanying drawing, on which.

DESCRIPTION OF THE PREFERRED EMBODIMENT

Figure 1:
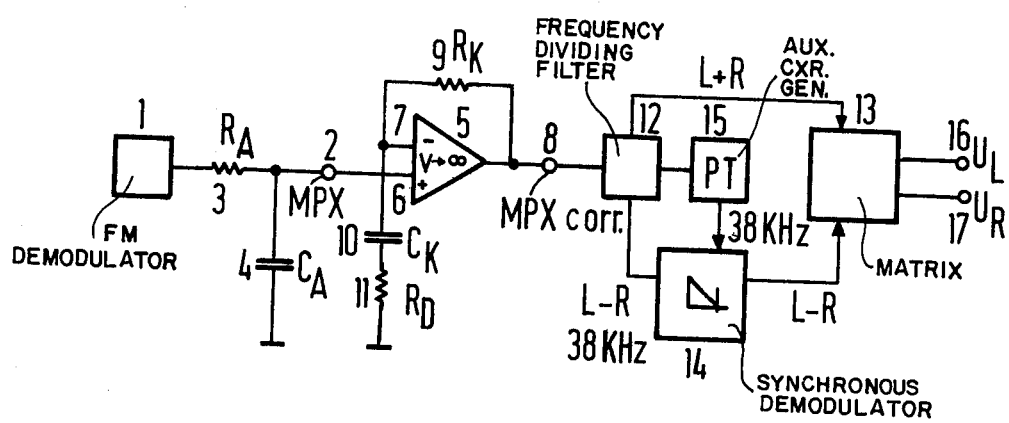
FIG. 1 is a schematic block circuit diagram of a decoder circuit.

Referring to FIG. 1, a FM demodulator is referenced 1 and via a connection line feeds a MPX signal to an input 2 of a correcting amplifier. The connection line has been symbolized by a series resistor 3 having a resistance value of $R_A$, and by a shunt capacitor 4 which is connected to the reference potential (ground) and which has capacitance value of $C_A$. The correcting amplifier contains an operational amplifier 5, provided with a non-inverting input 6, an inverting input 7 and an output 8. The output 8 carries a corrected signal which is referenced $MPX_{corr}$ and which represents the corrected, i.e. the linearized MPX signal. The output 8 of the operational amplifier 5 is fed back via a resistor 9 having a resistance value $R_K$ to the inverting input 7 of the operational amplifier 5. The inverting input 7 of the operational amplifier 5 is also connected to the reference potential by way of a capacitor 10 which has a capacitance value $C_K$ and a series resistor 11 having a resistance value $R_D$. The output 8 of the operational amplifier 5 is connected to a frequency dividing filter 12, which is connected by way of a sum signal path for a sum signal (L+R) and by way of a difference signal path for a difference signal (L−R) to a matrix 13. Connected into the difference signal path is a synchronous demodulator 14 which is operated by an auxiliary carrier of 38 kHz produced in a generator 15 from the pilot tone. The matrix 13 possesses two outputs 16 and 17, the output 16 carrying a reproduction signal $U_L$ and the output 17 carrying a reproduction signal $U_R$.

Under the simplifying condition that the FM demodulator 1 supplies an output signal with a linear frequency response, the MPX signal present at the output 2 of the correcting amplifier possesses a frequency response which is determined by the transmission factor of the low pass filter composed of the resistor 3 and the capacitor 4. This low pass filter has the transmission factor $$G_{TP} = 1/1 + j\omega R_A C_A.$$

Under the condition that the amplification is infinite, the correcting amplifier possesses a transmission factor of $$G_K = 1 + j\omega R_K C_K.$$

Hence, it has been initially assumed that the resistance value $R_D$ of the resistor 11 is equal to zero.

In order to correct the frequency response, it is now necessary for the product of the two transmission factors $G_{TP}$ of the low pass filter and $G_K$ of the correct amplifier to be independent of frequency within the range of up to 53 kHz. If the expressions for the two transmission factors $G_{TP}$ and $G_K$ are multiplied, then it will be seen that this frequency independence condition is fulfilled when $R_A \cdot C_A = R_K \cdot C_K$. Under this condition, at the input 8 for the stereo decoder, the MPX signal has a linear frequency response which extends to at least 53 kHz and which ensures a high attenuation of crosstalk between the two reproduction signals $U_L$ and $U_R$.

The resistor 11 represents an advantageous further development of the circuit of the invention. It serves to suppress natural oscillations of the correcting amplifier, and does not become operative until above the 53 kHz limit, so that it cannot impair the frequency correction in the range up to 53 kHz.

Figure 2:
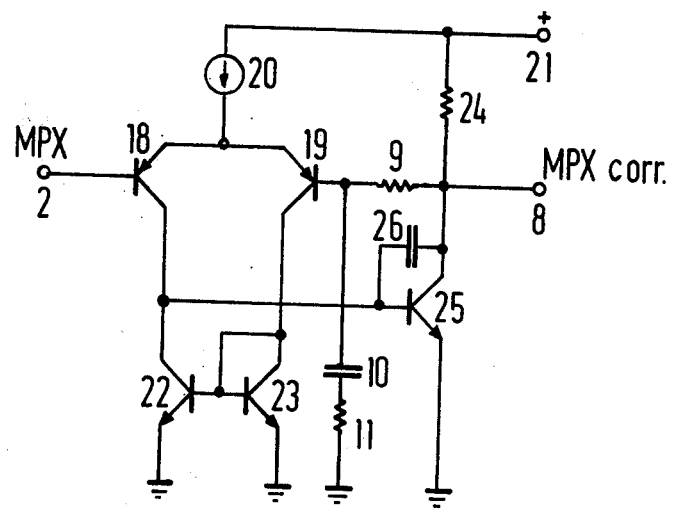
FIG. 2 is a schematic circuit diagram of a correcting amplifier constructed in accordance with the invention.

In FIG. 2, a correcting amplifier again has the input 2 for a MPX signal and an output 8 for a corrected MPX signal. It contains a differential amplifier having two transistors 18 and 19 which have their emitters interconnected. The input 2 is connected to the base of the transistor 18 and the emitters are connected, by way of a constant current source 20, to a terminal 21 for receiving a supply potential. The collector of the transistor 18 is connected by way of the collector-emitter path of a transistor 22 to the reference potential, and the collector of the transistor 19 is connected by way of the collector-emitter path of a transistor 23 to the reference potential. The bases of the two transistors 22 and 23 are connected to one another and to the collector of the transistor 23. The transistors 22 and 23 form a so-called current reflector, which ensures that the two collectors of the transistors 18 and 19 each conduct the same current. The base of the transistor 19 is connected by way of a resistor 9 to the output 8, and also via a series connection of a capacitor 10 and a resistor 11 to the reference potential. A resistor 24 is connected between the output 8 and the terminal 21 representing the supply potential. In addition, the output 8 is connected to the reference potential by way of the collectoremitter path of a transistor 25. The base of the transistor 25 is connected to the collector of the transistor 18 and, by way of a capacitor 26 to the collector of the transistor 25.

The transistor 18 represents the non-inverting input of the operational amplifier and the transistor 19 represents the inverting input thereof, to which, by way of the resistor 9, the output 8 is fed back. An amplifier transistor 25 is located between the output 8 and the collector of the input transistor 18. This circuit arrangement is highly suitable for construction in the integrated technique, in which case the resistors 9 and 11 and the capacitor 10 would form part of the external wiring. In particular, it is advantageous to use such a circuit arrangement as an input amplifier in an integrated decoder module.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A correcting amplifier for connection between a FM demodulator and a stereo decoder and matrix, in which matrix two reproduction signals are formed by sum and difference formation from a sum signal component of the output signal of the FM demodulator and a difference signal component converted from an auxiliary carrier frequency state to the audio frequency state by a synchronous demodulator connected to said stereo decoder, said correcting amplifier comprising:
- a high gain operational amplifier having an inverting input, a noninverting input and an output; and
- a RC feedback circuit connecting said output and said inverting input to provide a linear frequency response for the sum signal component and the difference signal component, said operational amplifier comprising
- a differential amplifier including first and second transistors each having a base, an emitter and a collector, said emitters connected together, said base of said first transistor connected to receive the output signal of the FM demodulator,
- a current reflector connecting said collectors of said first and second transistors to a reference potential,
- a constant current source connecting said emitters to a supply potential,
- a first resistor,
- a second resistor,
- a capacitor, and
- an amplifier transistor including a base connected to said collector of said first transistor, an emitter connected to the reference potential, and a collector connected to the supply potential via said first resistor and to said base of said second transistor via said second resistor and to the reference potential via said capacitor, and said collector providing the corrected signal output for connection to the stereo decoder.

2. The correcting amplifier of claim 1, comprising a third resistor connected in series with said capacitor to prevent natural oscillations of said correcting amplifier.

* * * * *